United States Patent [19]

Watanabe

[11] Patent Number: 4,959,709
[45] Date of Patent: Sep. 25, 1990

[54] SEMICONDUCTOR MEMORY DEVICE WITH CAPACITOR ON OPPOSITE SURFACE OF SUBSTRATE

[75] Inventor: Jinzo Watanabe, Hyogo, Japan

[73] Assignee: Mitsubishi Denki Kabushiki Kaisha, Tokyo, Japan

[21] Appl. No.: 276,596

[22] Filed: Nov. 28, 1988

[30] Foreign Application Priority Data

Dec. 2, 1987 [JP] Japan .................. 62-306135

[51] Int. Cl.⁵ .......................... H01L 29/78
[52] U.S. Cl. ...................... 357/23.6; 357/55; 437/47; 437/52
[58] Field of Search .......... 357/23.5, 23.6, 55; 437/47, 52; 365/185

[56] References Cited

U.S. PATENT DOCUMENTS

| | | | |
|---|---|---|---|
| 3,882,531 | 5/1975 | Michon et al. | 357/23.6 |
| 4,143,389 | 3/1979 | Koike et al. | 357/23.6 |
| 4,716,548 | 12/1987 | Mochizuki | 357/23.6 |
| 4,792,834 | 12/1988 | Uchida | 357/23.6 |

FOREIGN PATENT DOCUMENTS

| | | | |
|---|---|---|---|
| 61-289657 | 12/1986 | Japan | 357/23.6 |
| 62-72171 | 4/1987 | Japan | 357/23.5 |

Primary Examiner—Martin H. Edlow
Assistant Examiner—Donald L. Monin
Attorney, Agent, or Firm—Lowe, Price, LeBlanc, Becker & Shur

[57] ABSTRACT

The present invention provides a semiconductor memory device comprising a MOSFET (16) and a storage capacity element (15) and performing data writing/reading.

The MOSFET (16) is formed on a main surface of a silicon substrate (1) and a storage capacity element (15) is formed on a surface of the reverse side of the silicon substrate (1). The MOSFET (16) comprises source and drain regions (3, 4) formed on the main surface of the silicon substrate (1), a channel region (17) positioned therebetween and a word line forming a gate electrode (9a).

A trench (5) is formed in the surface of the reverse side of the silicon substrate (1) and the storage capacity element (15) comprises an insulating film (2) formed on the whole surface of the reverse side of the silicon substrate (1) including an inner wall surface of this trench, a cell plate electrode (7) formed on the surface of the reverse side of the silicon substrate (1) including the inside of the trench (5), and a diffusion region (13) of a memory cell portion connecting the insulating film (2) and the MOSFET (16).

8 Claims, 10 Drawing Sheets

SEMICONDUCTOR MEMORY DEVICE WITH CAPACITOR ON OPPOSITE SURFACE OF SUBSTRATE

BACKGROUND OF THE INVENTION

1. Field of the Invention

The present invention relates to a semiconductor memory device and a method for manufacturing thereof, more particularly, to a semiconductor memory device and a method for manufacturing thereof in which a higher degree of integration and larger capacity can be implemented.

2. Description of the Prior Art

FIG. 1 is a block diagram showing one example of a general structure of a RAM. Referring to FIG. 1, a memory cell array 101 comprises a plurality of word lines and bit lines arranged so as to intersect with each other and a memory cell (not shown) is provided at each intersecting point between a word line and a bit line. A specific memory cell is selected in accordance with an intersecting point between one word line selected by an X address buffer decoder 102 and one bit line selected by a Y address buffer decoder 103. Data is written into a selected memory cell or data stored in the memory cell is read by a reading/writing control signal (R/W) which is applied to a R/W control circuit 104. In data writing, input data (Din) is inputted to the selected memory cell through the R/W control circuit 104. On the other hand, in data reading, data stored in the selected memory cell is detected and amplified by a sense amplifier 105 and externally outputted as output data (Dout) through a data output buffer 106.

FIG. 2 is an equivalent circuit diagram of a dynamic memory cell shown for describing writing/reading operation of the memory cell.

Referring to FIG. 2, the dynamic memory cell comprises one field effect transistor 107 and one capacitor 108. The field effect transistor 107 has one conductive terminal connected to one electrode of the capacitor 108 and the other connected to the bit line 109. The field effect transistor 107 has its gate connected to a word line 110. The other electrode of the capacitor 108 is grounded. In data writing, the field effect transistor 107 becomes conductive when a predetermined potential is applied to the word line, so that an electric charge from the bit line 109 is stored in the capacitor 108. On the other hand, in data reading, the field effect transistor 107 becomes conductive when a predetermined potential is applied to the word line 110, so that an electric charge stored in the capacitor 108 is taken out through the bit line 109. As obvious from the above description, in accordance with the fact that the storage capacity of the memory cell is based on the capacity of the capacitor 108, various attempts are made to maintain and increase the capacity of individual memory capacitors in order to implement a high degree of integration of the memory cell array. Such attempts are described in, for example Japanese Patent Publication No. 56266/1983 and 55258/1986, and Japanese Patent Laying-Open Gazette No. 65559/1985. As one example of these attempts, a trench memory cell was developed in which its storage capacity can be maintained or increased by forming a trench on a semiconductor substrate and forming an electric charge storage region on the inner surface of the trench.

FIG. 3 is a plan view showing a dynamic RAM using such trench memory cell and FIG. 4 is a sectional view taken along a line IV—IV in FIG. 3. Referring to these figures, a description is made of a structure. Referring to FIGS. 3 and 4, a plurality of memory cells 14 are formed on a surface of a P type silicon substrate 1. In FIG. 3, the memory cells 14 are separated by a separating oxide film 6. Each memory cell 14 comprises an electric charge storage region 15 storing an electric charge, a transistor region 16 and an N+ region 3 connected to a bit line 11. More specifically, the electric charge storage region 15 comprises a trench portion 5 formed on the main surface of the P type silicon substrate 1, an N type diffusion region 13 of the memory cell portion formed on the inner surface of the trench 5, an N+ region 4 formed on one portion of the main surface of the P type silicon substrate 1 and serving as a storage terminal of the memory cell capacitor, a capacitor insulating film 2 formed so as to cover the inner surface of the trench 5, a polycrystalline silicon region 5a formed on the inner portion of the trench portion 5, and a cell plate electrode 7 formed on the capacitor insulating film 2 and the polycrystalline silicon region 5a and serving as a counter electrode of the memory capacitor. The transistor region 16 comprises N+ regions 3 and 4, a channel region 17 existing therebetween, and a word line 9a forming a gate electrode. The word lines 9a, 9b and 9c are covered with the interlayer insulating film 10.

The bit line 11 formed on the interlayer insulating film 10 is connected to the N+ region 3 through a contact hole 18. The cell plate electrode 7 and the word line 9b are separated by the interlayer insulating film 8.

Referring to FIG. 4, a description is made of reading/writing operation of data of the memory cell 14. In data writing, an inversion layer is formed on the channel region 17 when a predetermined potential is applied to the word line 9a and then the N+ region 3, and N+ region 4 and the diffusion region 13 of the memory cell portion become conductive. Therefore, an electric charge from the bit line 11 is transferred to the electric charge storage region 15 through the channel region 17 and stored in the diffusion region 13 of the memory portion. On the other hand, in data reading, an electric charge stored in the diffusion region 13 of the memory portion is externally taken out through the N+ region 3 and the bit line 11 when a predetermined potential is applied to the word line 9a.

Since an amount of electric charges stored in this way depends on the area of the diffusion region 13 of the memory cell portion formed on the inner surface of the trench portion 5, the formation of the trench portion 5 can contribute to the formation of relatively larger electric charge storage capacity than that of the plane occupied area of the electric charge storage region 15. More specifically, by forming the trench portion 5 and employing a trench capacitor using that trench portion, a capacitor having relatively large capacity can be obtained in the occupied area of the memory cell which is made small.

FIGS. 5A to 5E are sectional views of schematic processes showing a method for manufacturing a conventional device.

Referring to these figures, a description is made of this manufacturing method.

First, referring to FIG. 5A, a separating oxide film 6 is formed at a predetermined portion of a main surface 1a of a P type silicon substrate 1. Then, referring FIG. 5B, a trench portion 5 having a predetermined depth is formed on a predetermined portion of the silicon substrate 1. Then, a diffusion region 13 of a memory cell portion is formed by implanting ions of a conductivity type opposite to that of the semiconductor substrate 1 (in this case, N type) on the inner surface of the trench portion 5.

Referring to FIG. 5C, a capacitor insulating film 2 serving as an oxide film is formed on the whole surface of the silicon substrate 1 including the inner surface of the trench portion 5. Thereafter, polysilicon 5a is filled in the trench portion 5 having its inner surface covered with the capacitor insulating film 2. Then, a cell plate electrode 7 having a plane portion of a predetermined configuration is formed so as to cover the trench portion 5 and interlayer insulating film 8 having a plane portion of a predetermined configuration is formed on the cell plate electrode 7.

Referring to FIG. 5D, polysilicon is deposited on the whole surface to apply a resist and word lines 9a, 9b and 9c are formed by photolithography and etching. N+ regions 3 and 4 are formed by implanting ions of a conductivity type opposite to that of the silicon substrate 1 (in this case, N type ion) on the exposed main surface of the silicon substrate 1. Then, an interlayer insulating film 10 is formed by depositing an oxide film by way of a CVD method on the whole surface of the silicon substrate 1 including the word lines 9a, 9b and 9c.

Referring to FIG. 5E, a contact hole 18 reaching the N+ region 3 is formed at a predetermined position of the interlayer insulating film 10 by performing photolithography and etching. Finally, aluminum is deposited on the interlayer insulating film 10 and in the contact hole 18, and bit line 11 connected to tee N+ region 3 is formed by patterning the aluminum.

Since the conventional semiconductor memory device was structured as described above, it was necessary to form elements each having a minute length of 0.5 μm or less in case the degree of integration of 16 M bit or more is to be made.

However, referring to FIG. 4, there was a problem in which it is difficult to obtain enough an amount of storage electric charges because the electric charge storage region 15 serving as a storage capacity element has to be made small as the dimension of the each IC portion is made small.

SUMMARY OF THE INVENTION

It is an object of the present invention to provide a semiconductor memory device and a method for manufacturing thereof in which the amount of storage electric charges on an electric charge storage region is increased and high degree of integration can be implemented.

In order to attain the above described purpose, a semiconductor memory device in accordance with the present invention comprises a semiconductor substrate having a main surface and a surface on the reverse side, a MOSFET formed on the main surface of the semiconductor substrate, and a storage capacity element formed on the surface of the reverse side of the semiconductor substrate, the storage capacity element having one and the other electrodes, the one electrode of the storage capacity element being connected to said MOSFET, and the other electrode of the storage capacity element being formed on the surface of the reverse side of the semiconductor substrate.

A method for manufacturing a semiconductor memory device in accordance with another aspect of the present invention comprises the steps of preparing a semiconductor substrate having a main surface and surface of the reverse side, forming a MOSFET on the main surface of the semiconductor substrate, forming a storage capacity element on the surface of the reverse side of the semiconductor substrate and forming a diffusion region of a memory cell portion in the semiconductor substrate for connecting the MOSFET to the storage capacity element.

In the semiconductor memory device in accordance with the present invention, the other electrode of the storage capacity element is formed on the surface of the reverse side of the semiconductor substrate. The reverse side of the semiconductor substrate is a portion which has nothing to do with a high degree of integration and in this portion, the other electrode of the storage capacity element is formed, so that the dimension of the electric charge storage region can be increased, whereby the amount of the storage electric charges can be increased. In addition, since the electric charge storage region is formed on the surface of the reverse side of the semiconductor substrate, each element formed on the main surface of the semiconductor substrate can be made small without making the electric charge storage region small, so that a high degree of integration can be implemented.

In a method for manufacturing the semiconductor memory device in accordance with another aspect of the present invention, since the storage capacity element is formed on the surface of the reverse side of the semiconductor substrate, which side has nothing to do with a high degree of integration, it is not necessary to make the electric charge storage region small even when a high degree of integration is implemented, whereby the yield thereof can be improved.

The foregoing and other objects, features, aspects and advantages of the present invention will become more apparent from the following detailed description of the present invention when taken in conjunction with the accompanying drawings.

The same references are allotted to the same or corresponding portions throughout the figures.

DESCRIPTION OF THE PREFERRED EMBODIMENTS

Referring to the figures, a description is made of an embodiment of the present invention.

Figure 1:
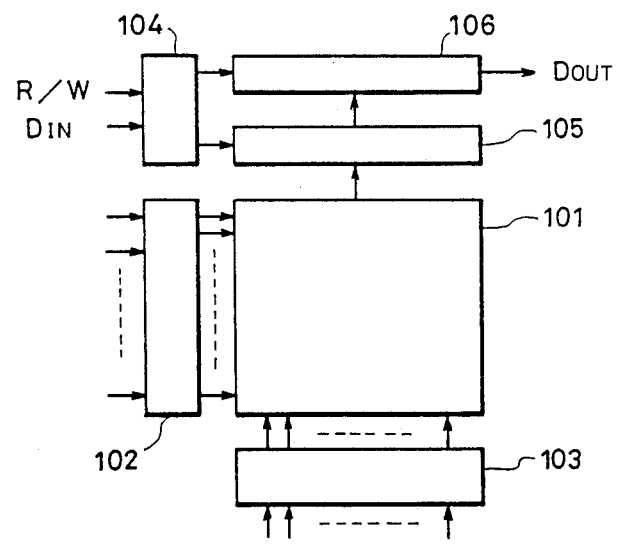
FIG. 1 is a block diagram showing one example of a structure of a ordinary RAM.
Figure 2:
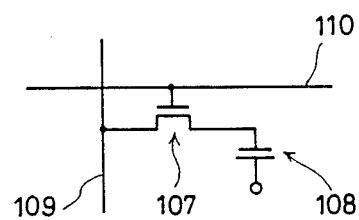
FIG. 2 is an equivalent circuit diagram of a dynamic memory cell shown for describing writing/reading operation of a memory cell.
Figure 3:
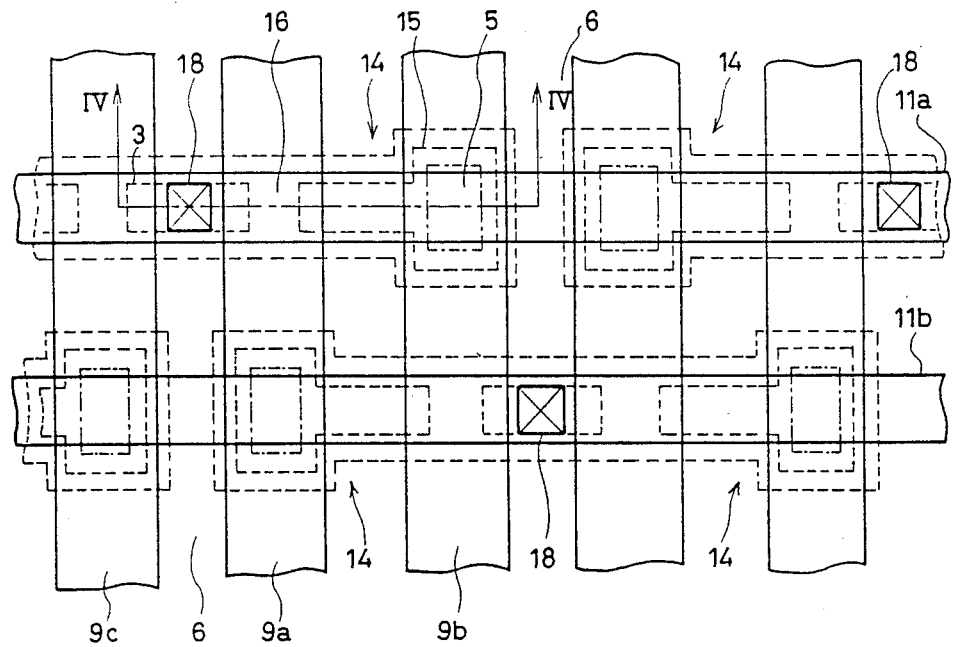
FIG. 3 is a plan view showing a dynamic RAM using a conventional trench memory cell.
Figure 4:
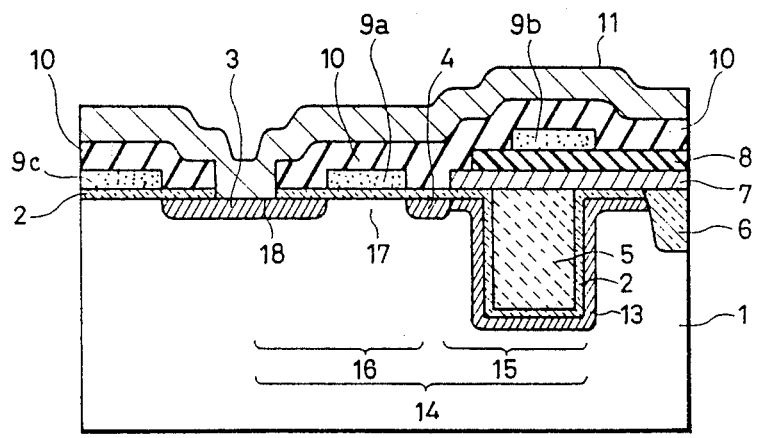
FIG. 4 is a sectional view taken along a line IV—IV in FIG. 3.
Figure 5A:
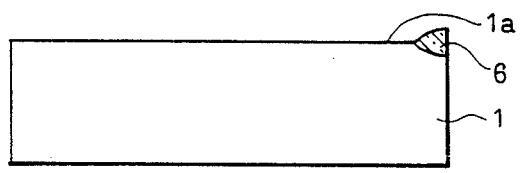
FIGS. 5A to 5E are sectional views of schematic processes showing a method for manufacturing the conventional device.
Figure 5B:
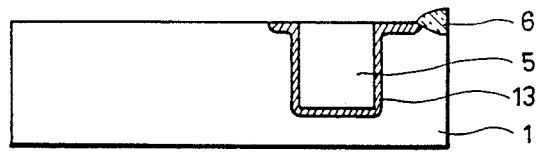
Figure 5C:
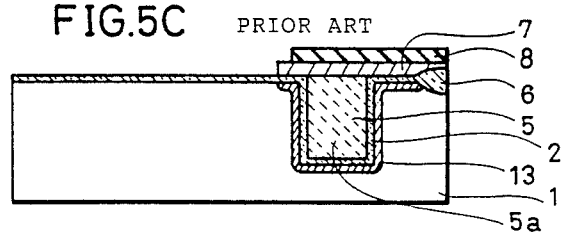
Figure 5D:
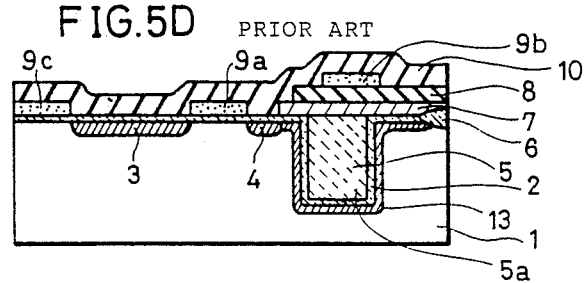
Figure 5E:
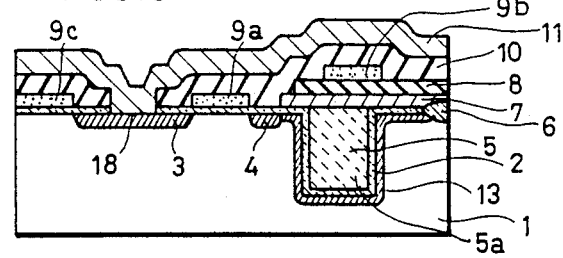
Figure 6:
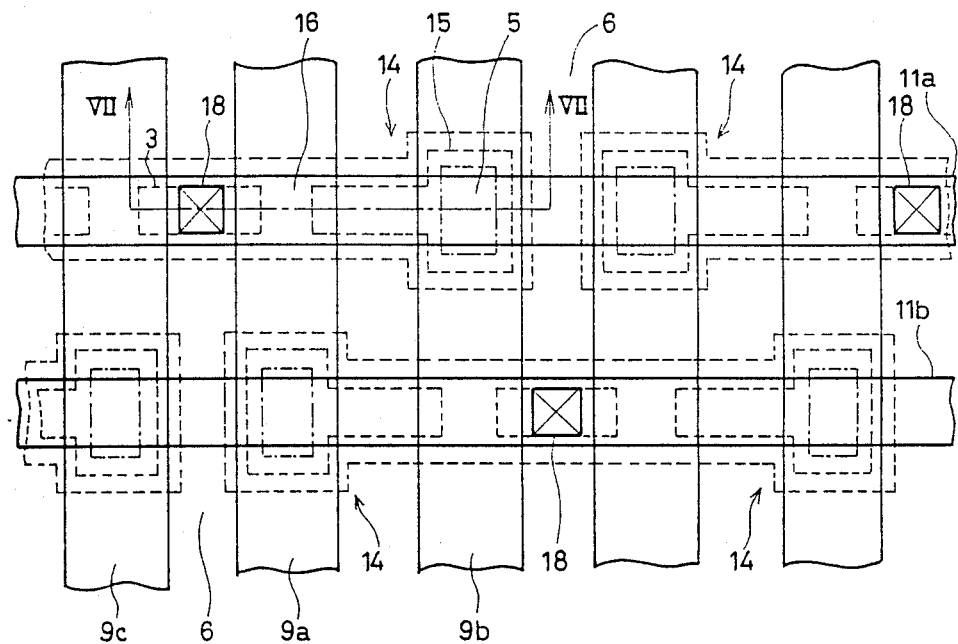
FIG. 6 is a plan view showing a semiconductor memory device in accordance with one embodiment of the present invention.
Figure 7:
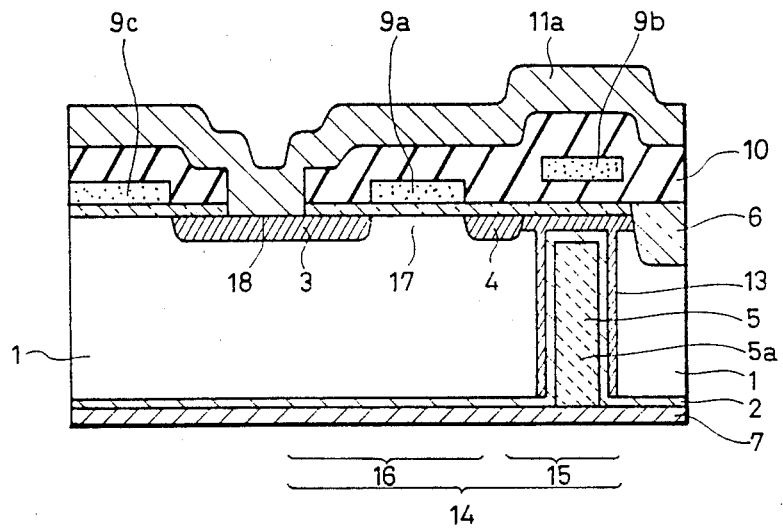
FIG. 7 is a sectional view taken along a line VII—VII in FIG. 6.

FIG. 6 is a plan view showing a semiconductor memory device in accordance with one embodiment of the present invention and FIG. 7 is a sectional view taken along a line VII—VII in FIG. 6. Since its equivalent circuit diagram is the same as that shown in FIG. 2, it is omitted.

Referring to these figures, a description is made of a structure. Referring to FIGS. 6 and 7, a plurality of memory cells 14 are formed on a main surface of a semiconductor substrate 1 which is, for example, a P type silicon substrate.

In FIG. 6, the memory cells 14 are separated by an separating oxide film 6. Each memory cell 14 comprises an electric charge storage region 15 storing an electric charge, a transistor region 16 and an N+ region 3 connected to a bit line 11. More specifically, the electric charge storage region 15 comprises a trench portion 5 formed to extend from the surface of the reverse side toward the main surface of the semiconductor substrate 1, an N type diffusion region 13 of the memory cell portion formed in the main surface of the trench portion 5, an N+ region 4 formed on one portion of the main surface of the semiconductor substrate 1 and serving as a storage terminal of a memory cell capacitor, a capacitor insulating film 2 formed on the whole surface of the reverse side of the semiconductor substrate 1 including the inner surface of the trench portion 5, a polycrystalline silicon region 5a deposited in the trench portion 5 so as to sandwich the capacitor insulating film 2, and a cell plate electrode 7 forced so as to cover the capacitor insulating film 2 and exposed surface of the polycrystalline silicon region 5a and serving as a counter electrode of the memory capacitor. The transistor region 16 comprises N+ regions 3 and 4 formed on the main surface of the substrate 1, a channel region 17 existing therebetween and a word line 9a forming a gate electrode. The word lines 9a, 9b and 9c are covered with an interlayer insulating film 10.

The bit line 11a formed on the interlayer insulating film 10 is connected to the N+ region 3 through the contact hole 18.

Referring to FIG. 7, a description is made of writing/reading operation of data of the memory cell 14. In data writing, when a predetermined potential is applied to the word line 9a, the inversion layer is formed on the channel region 17 and, then the N+ region 3, N+ region 4 and the diffusion region 13 of the memory portion become conductive. Therefore, an electric charge from the bit line 11a is transferred to the electric charge storage region 15 through the channel region 17 and stored in the diffusion region 13 of the memory cell portion. On the other hand, in data reading, when a predetermined potential is applied to the word line 9a, an electric charge stored in the diffusion region 13 of the memory cell portion is externally taken out through the inverted channel region 17, the N+ region 3 and the bit line 11a.

As described above, in the semiconductor memory device in accordance with the embodiment, the cell plate electrode 7 of the storage capacity element is formed on the surface of the reverse side of the semiconductor substrate 1. The reverse side of the semiconductor substrate 1 has nothing to do with a high degree of integration and the cell plate electrode 7 of the storage capacity element is formed on this portion, so that the dimension of the electric charge storage region 15 can be make large, whereby the amount of stored electric charge can be increased. In addition, since the electric charge storage region 15 is formed on the reverse side of the semiconductor substrate 1 which has nothing to do with a high degree of integration, each element formed on the main surface of the semiconductor substrate 1 can be made small without making the electric charge storage region 15 small, consequently a high degree of integration can be implemented.

FIGS. 8A to 8D are sectional views of schematic processes showing a method for manufacturing a semiconductor memory device in accordance with the above described embodiment.

Referring to these figures, a description is made of this manufacturing method.

Figure 8A:
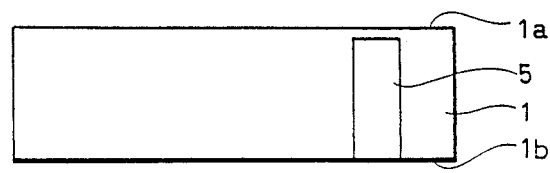
FIGS. 8A to 8D are sectional views of schematic processes showing a method for manufacturing the semiconductor memory device in accordance with one embodiment of the present invention.

First, referring to FIG. 8A, a trench portion 5 is formed on a predetermined portion of a surface 1b of the reverse side of a semiconductor substrate 1 which is, for example, a P type silicon substrate. The trench portion 5 is formed deeply from the surface 1b of the reverse side of the semiconductor substrate 1 such that the bottom portion thereof may be positioned near the main surface 1a of the semiconductor substrate 1.

Figure 8B:
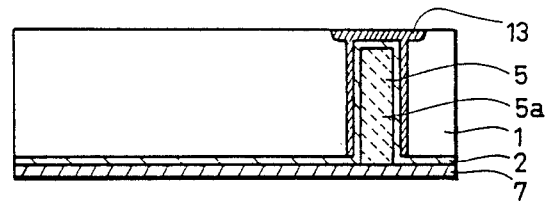

Referring to FIG. 8B, a diffusion region 13 of the memory cell portion is formed by implanting an ion of conductivity type opposite to that of the semiconductor substrate 1 (in this case an N type ion) on the inner surface of the trench portion 5. Thereafter, a capacitor insulating film 7 serving as an oxide film is formed on the surface of the reverse side of &.he semiconductor substrate including the inner surface of the trench portion 5. Thereafter, by using a CVD method polysilicon 5a is filled in the trench portion 5 having its inner surface covered with the capacitor insulating film 2. Then, a cell plate electrode 7 of polysilicon is formed on the whole surface of the reverse side of the semiconductor substrate 1 including the exposed surface of the polysilicon 5a deposited on the inner portion of the trench portion 5.

Figure 8C:
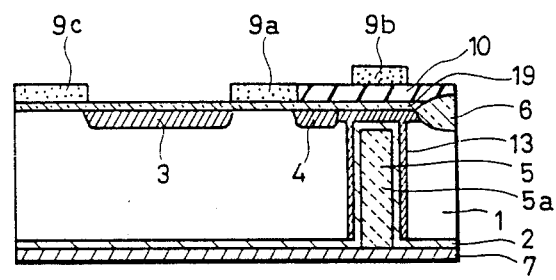

Referring to FIG. 8C, an isolating oxide film 6 is formed on a predetermined portion of the main surface of the semiconductor substrate 1 and a gate oxide film 19 is formed on the whole main surface. Then, polysilicon is deposited on the whole surface and word lines 9a and 9c are formed at a predetermined portion by photolithography and etching. Next, N+ regions 3 and 4 are formed by implanting ions of a conductivity type opposite to that of the semiconductor substrate 1 (in this case, an N type ion) on the main surface of the exposed semiconductor substrate 1. Thereafter, an interlayer insulating film 10 serving as an oxide film having a plane portion of a predetermined configuration is formed over the trench portion 5 and a word line 9 of a predetermined configuration is formed thereon.

Figure 8D:
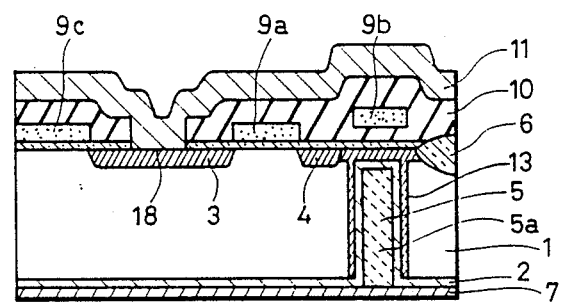

Referring to FIG. 8D, an interlayer insulating film 10 is formed by depositing an oxide film by a CVD method on the whole main surface of the semiconductor substrate 1 including the word lines 9a, 9b and 9c. Then, by photolithography and etching, a contact hole 18 reaching the N+ region 3 is formed at a predetermined portion of the interlayer insulating film 10. Finally, aluminum is deposited on the whole surface on the interlayer insulating film 10 and in the contact hole 18 and a bit line 11a connected to the N+ region 3 is formed by patterning this aluminum.

According to the above described manufacturing method, since a storage capacity element is formed on the surface lb of the reverse side of the semiconductor substrate 1 which has nothing to do with a high degree of integration, it is not necessary to make the electric charge storage region small even when the high degree of integration is implemented on the main surface 1a of the semiconductor substrate 1, whereby the yield thereof is improved.

Figure 9:
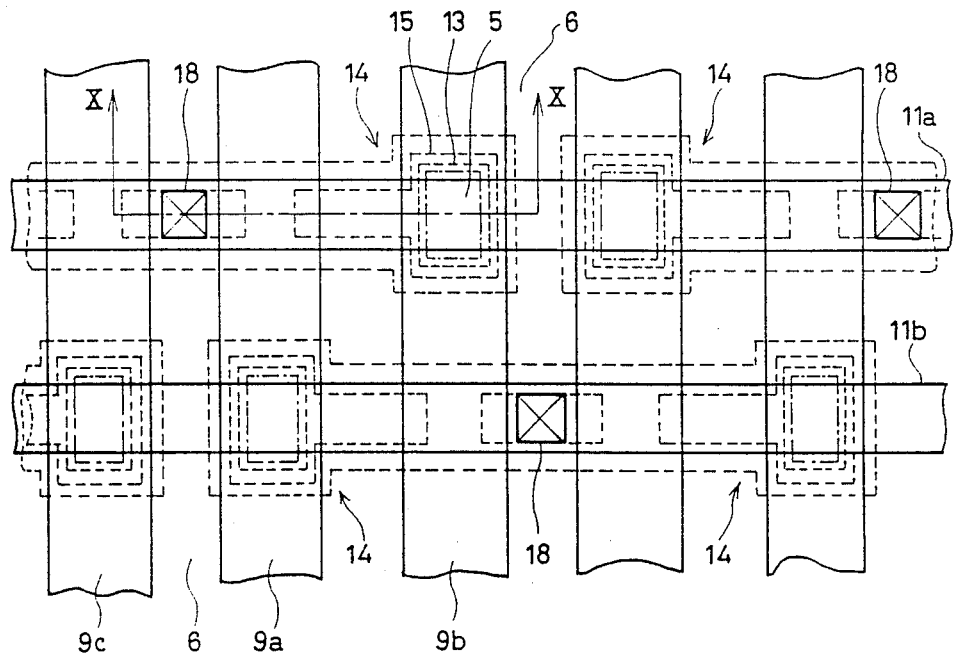
FIG. 9 is a plan view showing a semiconductor memory device in accordance with another embodiment of the present invention.
Figure 10:
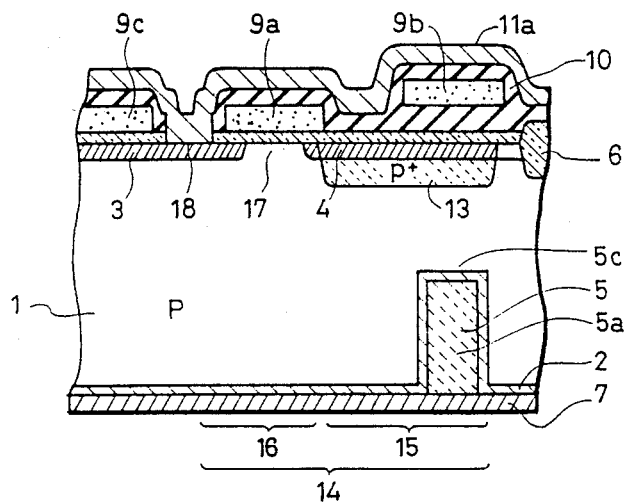
FIG. 10 is a sectional view taken along a line X—X in FIG. 9.
Figure 11:
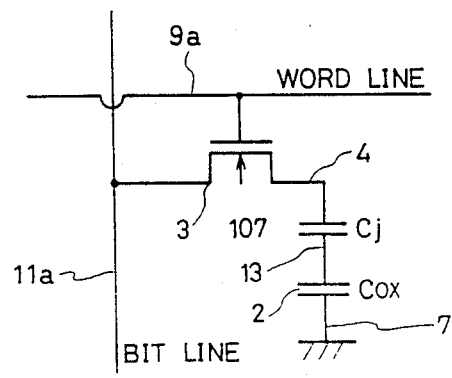
FIG. 11 is an equivalent circuit diagram of a semiconductor memory device shown in FIGS. 9 and 10.

FIG. 9 is a plan view showing a semiconductor memory device in accordance with another embodiment of the present invention, FIG. 10 is a sectional view taken along a line X—X in FIG. 9 and FIG. 11 is an equivalent circuit diagram of this semiconductor memory device.

Referring to FIGS. 9 and 10, a description is made of a structure.

A plurality of memory cells 14 are formed on a surface of a semiconductor substrate 1 which is, for example a P type silicon substrate. In FIG. 9, the memory cells 14 are separated by a separating oxide film 6. The memory cell 14 comprises an electric charge storage region 15 storing an electric charge, a transistor region 16 and an N+ region 3 connected to a bit line 11a. More specifically, the electric charge storage region 15 comprises a trench portion 5 (a bottom portion of this trench portion 5 is placed in the middle of the reverse surface and the main surface of the semiconductor substrate 1 in the figure) formed from the surface of the reverse side toward the main surface of the semiconductor substrate 1, a diffusion region 13 cf a memory cell portion of the same conductivity type (P type) as that of the semiconductor substrate 1 and formed on a predetermined position of the main surface of the semiconductor substrate 1 (the position is opposite to the trench portion 5), a region (N+ region 4) of a conductivity type opposite to that of the semiconductor substrate 1 and formed on one portion of the main surface of the semiconductor substrate 1 and serving as a storage terminal of a memory cell capacitor, a capacitor insulating film 2 formed on the whole surface of the reverse side of the semiconductor substrate 1 including the inner surface of the trench portion 5, a polycrystalline silicon region 5a deposited on the inner portion of the trench portion 5 so as to sandwich the capacitor insulating film 2, and a cell plate electrode 7 formed so as to cover the capacitor insulating film 2 and the exposed surface of the polycrystalline silicon region 5a and serving as a counter electrode of the memory capacitor. The transistor region 16 comprises N+ regions 3 and 4 formed on the main surface of the semiconductor substrate 1, a channel region 17 existing therebetween and a word line 9a forming a gate electrode. The word lines 9a, 9b and 9c are covered with the interlayer insulating film 10. The bit line 11a formed on the interlayer insulating film 10 is connected to the N+ region 3 through the contact hole 18. FIG. 11 is an equivalent circuit diagram of a memory cell of the semiconductor memory device shown in FIGS. 9 and 10.

Referring to FIG. 11, the memory cell comprises a MOSFET 107, a P-N junction capacitor Cj, and an oxide film capacitor Cox. The MOSFET 107 has its one conductive terminal 4 connected to one electrode of the capacitor Cj and the other terminal 3 connected to the bit line 11a. The other electrode 13 of the capacitor Cj is connected to one electrode of the capacitor Cox and the other electrode 7 of the capacitor Cox is grounded. The gate electrode of the MOSFET 10 is connected to the word line 9a.

Referring to FIGS. 10 and 11, a description is made of writing/reading operation of data of the memory cell 14. In data writing, when a predetermined potential is applied to the word line 9a, an inversion layer is formed on the channel region 17 and the N+ regions 3 and 4 become conductive. Therefore, an electric charge from the bit line 11a is transferred to the electric charge storage region 15 through the channel region 17 and stored in the inner surface portion 5c of the trench portion 5 connected to the diffusion region 13 of the memory cell portion and the capacitor insulating film 2. On the other hand, in data reading, when a predetermined potential is applied to the word line 9a, an electric charge stored in the capacitor Cj and the capacitor Cox is taken out through the inverted channel region 17, the N+ region and the bit line 11a.

As described above, in the semiconductor memory device in accordance with another embodiment of the present invention, the cell plate electrode 7 of the storage capacity element is formed on the surface of the reverse side of the semiconductor substrate 1. Since this reverse surface of the semiconductor substrate 1 has nothing to do with the implementation of the high degree of integration and a semiconductor memory device is constituted such that the cell plate electrode 7 of the storage capacity element is formed on this portion, the dimension of the electric charge storage region 15 can be made large, so that the amount of storage electric charges can be increased. In addition, since the electric charge storage region 15 is formed on the surface of the reverse side of the semiconductor substrate 1 which has nothing to do with a high degree of integration, each element formed on the main surface of the semiconductor substrate 1 can be made small without making the electric charge storage region small, whereby the high degree of integration can be implemented. In addition, since the trench portion 5 need not be formed deeply, the trench portion 5 can be formed easily.

FIGS. 12A to 12E are schematic sectional views of the device showing a method for manufacturing a semiconductor memory device in accordance with another embodiment of the present invention.

Referring to these figures, the manufacturing method is described.

Figure 12A:
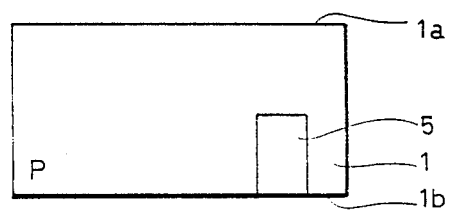
FIGS. 12A to 12E are sectional views of schematic processes showing a method for manufacturing a semiconductor memory device in accordance with another embodiment of the present invention.

First, referring to FIG. 12A, a trench portion 5 having a predetermined depth is formed on a predetermined portion on the surface 1d of the reverse side of the semiconductor substrate 1 which is, for example, a P type silicon substrate.

Figure 12B:
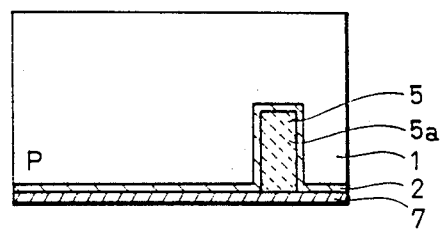

Then, referring to FIG. 12B, a capacitor insulating film 2 serving as an oxide film is formed on the whole surface of the surface 1b of the reverse side of the semiconductor substrate 1 including an inner surface of the trench portion 5 by thermal oxidation. Thereafter, polysilicon 5a is filled in the inner portion of the trench portion 5 having its inner surface covered with the capacitor insulating film 2 by a CVD method. Next, a cell plate electrode 7 formed of polysilicon is formed on the whole surface of the reverse side of the semiconductor substrate 1 including the exposed surface of the polysilicon 5a deposited in the trench portion 5.

Figure 12C:
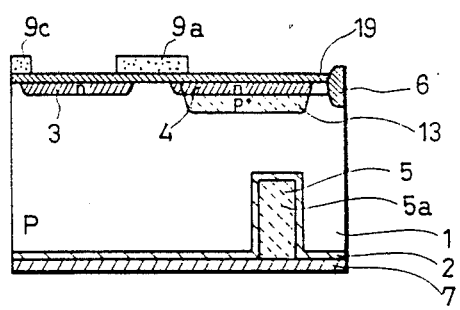

Referring to FIG. 12C, an isolating oxide film 6 is formed on a predetermined portion of a main surface 1a of the semiconductor substrate 1 and a diffusion region 13 of a memory cell portion which is an impurity region of the same conductivity type P+ as that of the semiconductor substrate 1, is formed on a portion opposite to the trench portion 5 of the main surface 1a of the semiconductor substrate 1. A gate oxide film 19 is formed on the main surface 1a of the semiconductor substrate 1 by thermal oxidation. Then, polysilicon is deposited on the whole surface and a resist is applied and then word lines 9a and 9c are formed on a predetermined position by photolithography and etching. Next, N+ regions 3 and 4 are formed by implanting ions of a conductivity type opposite to that of the semiconductor substrate 1 (in this case, an N type ion) the exposed main surface of the semiconductor substrate 1.

Figure 12D:
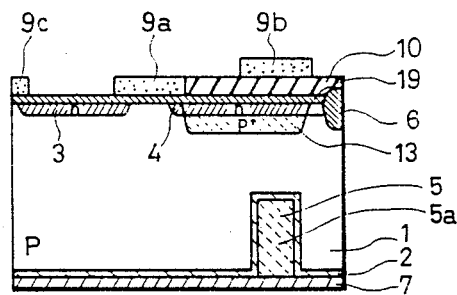

Referring to FIG. 12D, an interlayer insulating film 10 serving as an oxide film having a plane portion of a predetermined configuration is formed on the gate oxide film 19 above the trench portion 5 and a word line 9b is formed thereon.

Figure 12E:
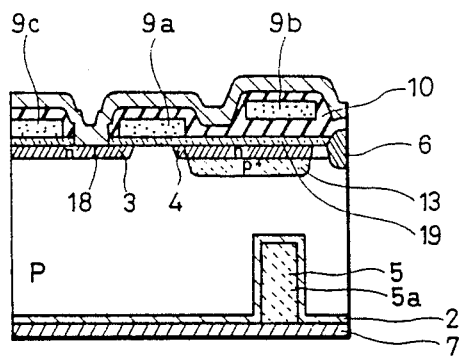

Referring to FIG. 12E, an interlayer insulating film 10 is formed by depositing an oxide film on the whole main surface of the semiconductor substrate 1 including the word lines 9a, 9b and 9c by means of CVD method. Then, a contact hole 18 reaching the N+ region 3 is formed on a predetermined position of the interlayer insulating film 10 by photolithography and etching. Finally, aluminum is deposited on the whole surface of the interlayer insulating film 10 and in the contact hole 18, and a bit line 11a in contact with the N+ region 3 is formed by patterning this aluminum.

According to the above described manufacturing method, since the storage capacity element is formed on the surface 1d of the reverse side of the semiconductor substrate 1 which has nothing to do with a high degree of integration, even when a high degree of integration is implemented on the main surface 1a of the semiconductor substrate 1, it is not necessary to make the storage capacity element small, whereby the yield thereof is improved. In addition, in this embodiment, since the trench portion 5 need not be formed deeply, it becomes easy to form the trench portion 5.

Figure 13:
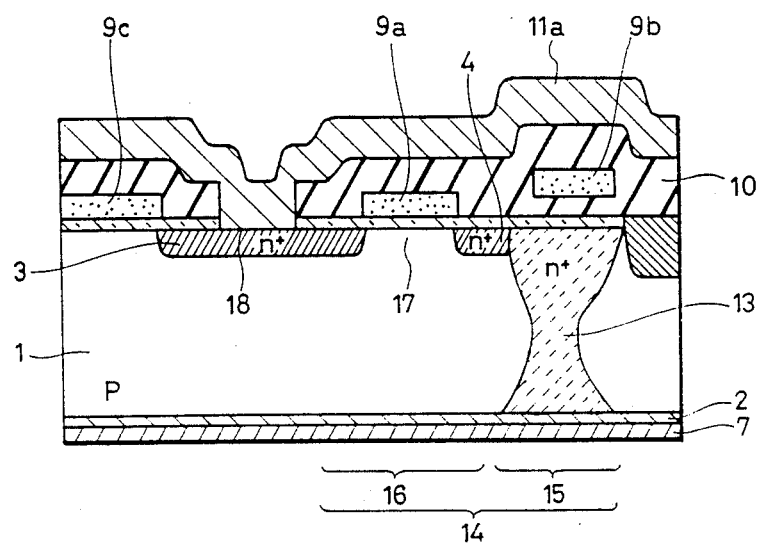
FIG. 13 is a sectional view showing a semiconductor memory device in accordance with still another embodiment of the present invention.

FIG. 13 is a sectional view showing a semiconductor memory device in accordance with a further embodiment of the present invention.

Referring to FIG. 13, a structure is described. A memory cell 14 comprises an electric charge storage region 15 storing an electric charge, a transistor region 16 and an N+ region 3 connected to a bit line 11. More specifically, the electric charge storage region 15 comprises an N type diffusion region 13 of a memory cell portion formed from a surface of the reverse side toward a main surface of the semiconductor substrate 1 which is, for example, a P type silicon substrate, an N+ region 4 formed on one portion of the main surface of the semiconductor substrate 1 and serving as a memory terminal of the memory capacitor, a capacitor insulating film 2 formed on the surface of the reverse side of the semiconductor substrate 1 and a cell plate electrode 7 formed on the whole surface of the reverse side of the semiconductor substrate 1 so as to sandwich the capacitor insulating film 2 and serving as a counter electrode of the memory capacitor. The transistor region 16 comprises N+ regions 3 and 4 formed on the main surface of the semiconductor substrate 1, a channel region 17 existing therebetween and a word line 9a constituting a gate electrode. The word lines 9a, 9b and 9c are covered with the interlayer insulating film 10. The bit line 11a formed on the interlayer insulating film 10 is connected to the N+ region 3 through the contact hole 18.

Referring to FIG. 13, a description is made of data writing/reading operation of the memory cell 14. In data writing, when a predetermined potential is applied to a word line 9a, an inversion layer is formed on the channel region 17, so that the N+ regions 3 and 4 and the diffusion region 13 of the memory cell portion become conductive. Therefore, an electric charge from the bit line 11 is transferred to the electric charge storage region 15 through the channel region 17 and stored in the diffusion region 13 of the memory cell portion (particularly, the portion connecting to the capacitor insulating film 2). On the other hand, in data reading, when a predetermined potential is applied to the word line 9a, an electric charge stored in the diffusion region 13 of the memory cell portion is externally taken out through the inverted channel region 17, the N+ region 3 and the bit line 11.

As described above, in the semiconductor memory device in accordance with a further embodiment of the present invention, the cell plate electrode 7 of the storage capacity element is formed on the surface of the reverse side of the semiconductor substrate 1. Since the surface of the reverse side of the semiconductor substrate 1 has nothing to do with the implementation of the high degree of integration and the semiconductor memory device is configured so that the cell plate electrode 7 of the storage capacity element may be formed on this portion, the dimension of the electric charge storage region 15 can be made large, whereby the amount of the storage electric charges can be increased. The electric charge storage region 15 is formed on the surface of the reverse side of the semiconductor substrate 1 which has nothing to do with the implementation of the high degree of integration, so that each element formed on the main surface of the semiconductor substrate 1 can be made small without making the electric charge storage region 15 small and a high degree of integration can be implemented. In addition, since the trench portion is not formed, it is possible to configure the semiconductor memory device such that the dimension of the electric charge storage region 15 can be made large.

FIGS. 14A to 14E are schematic sectional views of the device showing a method for manufacturing the semiconductor memory device in accordance with a further embodiment of the present invention. Referring to these figures, the manufacturing method is described.

Figure 14E:
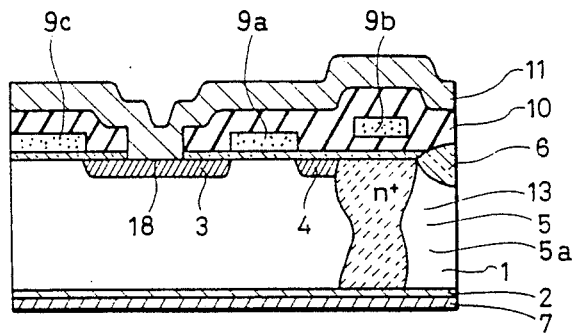
FIGS. 14A to 14E are sectional views of schematic processes showing a method for manufacturing the semiconductor memory device in accordance with still another embodiment of the present invention.
Figure 14A:
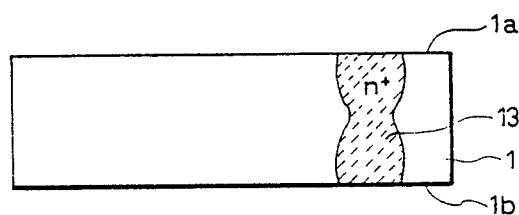

First, referring to FIG. 14A, a semiconductor substrate 1, for example, a P type silicon substrate is prepared, and by way of isolation diffusion, N+ impurity ions are implanted from a main surface 1a and a surface of the reverse side of the semiconductor substrate 1, so that a diffusion region 13 of a memory cell portion penetrating the semiconductor substrate is formed by diffusing these ions.

Figure 14B:
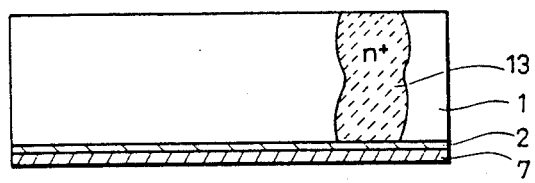

Referring to FIG. 14B, a capacitor insulating film 2 serving as an oxide film is formed on the whole surface 1b of the surface side of the semiconductor substrate 1. A cell plate electrode 7 formed of polysilicon is formed on the surface 1b of the reverse side of the semiconductor substrate 1 so as to sandwich the capacitor insulating film 2.

Figure 14C:
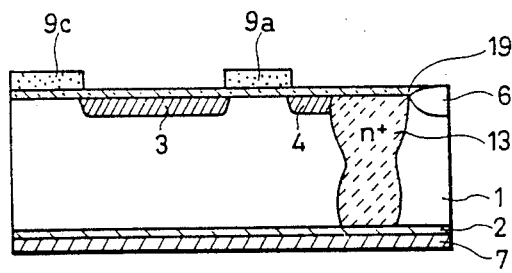

Referring to FIG. 14C, an insulating oxide film 6 is formed on a predetermined portion of the main surface 1a of the semiconductor substrate 1. Thereafter, a gate oxide film 19 is formed on the main surface 1a of the semiconductor substrate 1 by thermal oxidation. Then, polysilicon is deposited on the whole surface, and a resist is applied and then word lines 9a and 9c are formed at a predetermined position by photolithography and etching. Next, N+ regions 3 and 4 are formed by implanting ions of a conductivity type opposite to that of the semiconductor substrate 1 (in this case, N type ions) on the exposed main surface of the semiconductor substrate 1.

Figure 14D:
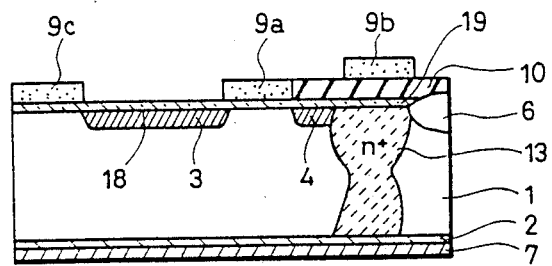

Referring to FIG. 14D, an interlayer insulating film 10 serving as an oxide film having a plane portion of a predetermined configuration is formed on the gate oxide film 19 above the diffusion region 13 of the memory cell portion by a CVD method and a word line 9d is formed thereon.

Referring to FIG. 14E, an interlayer insulating film 10 is formed by depositing an oxide film on the whole main surface of the semiconductor substrate 1 including the word lines 9a, 9b and 9c by a CVD method. Then, a contact hole reaching the N+ region 3 is formed on a predetermined position of the interlayer insulating film 10 by photolithography and etching. Finally, a bit line 11 in contact with the N+ region 3 is formed by depositing aluminum on the whole surface of the interlayer insulating film 10 and the contact hole 18 and patterning this aluminum.

According to the above described manufacturing method, since the storage capacity element is formed on the reverse side 1b of the semiconductor substrate 1 which has nothing to do with the implementation of the high degree of integration, even when a high degree of integration is implemented on the main surface 1a of the semiconductor substrate, it is not necessary to make the storage capacity element small, whereby the yield thereof is improved. In addition, since a trench portion is not formed in this embodiment, a step of forming the trench portion is not required, so that the yield thereof is more improved.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A semiconductor memory device comprising:
    a semiconductor substrate having a main surface and a surface on the reverse side;
    a MOSFET formed on the main surface of said semiconductor substrate; and
    a storage capacity element formed on the surface of the reverse side of said semiconductor substrate,
    said storage capacity element having one and another electrode,
    said one electrode of said storage capacity element being connected to said MOSFET, and
    said another electrode of said storage capacity element being formed on the surface of the reverse side of said semiconductor substrate.

2. A semiconductor memory device in accordance with claim 1, wherein a trench is formed on the surface of the reverse side of said semiconductor substrate, and said storage capacity element comprising:
    an insulating film formed on the surface of the reverse side of said semiconductor substrate including an inner wall surface of said trench;
    a conductor formed on the surface of the reverse side of said semiconductor substrate including the inside of said trench so as to sandwich said insulating film; and
    a diffusion region of a memory cell portion connecting said insulating film to said MOSFET.

3. A semiconductor memory device in accordance with claim 2, wherein said conductor comprising:
    a first conductor filled in the inside of said trench; and
    a second conductor formed on the surface of the reverse side of said semiconductor substrate in contact with the exposed surface of said first conductor.

4. A semiconductor memory device in accordance with claim 2, wherein said trench is formed to extend deeply from the surface of the reverse side of said semiconductor substrate and the bottom portion of said trench is positioned near the main surface of said semiconductor substrate.

5. A semiconductor memory device in accordance with claim 1, wherein said storage capacity element comprises:
    an insulating film formed on the surface of the reverse side of said semiconductor substrate;
    a conductor formed on said insulating film; and
    a diffusion region of a memory cell portion connecting said insulating film to said MOSFET.

6. A semiconductor memory device in accordance with claim 3, wherein said first conductor is polysilicon.

7. A semiconductor memory device in accordance with claim 3, wherein said second conductor is polysilicon.

8. A semiconductor memory device in accordance with claim 2, wherein said insulating film is an oxide film.

* * * * *